(12) United States Patent
Lin et al.

(10) Patent No.: US 7,994,961 B1
(45) Date of Patent: Aug. 9, 2011

(54) SYSTEMS AND METHODS FOR PROVIDING AN ANALOG-TO-DIGITAL CONVERTER THAT USES REDUCED POWER AND SUPPLY VOLTAGE

(75) Inventors: Hung Sheng Lin, San Jose, CA (US); Ovidiu Carnu, San Francisco, CA (US); Shingo Hatanaka, San Jose, CA (US)

(73) Assignee: Marvell International Ltd (BM)

( * ) Notice: Subject to any disclaimer, the term of this patent is extended or adjusted under 35 U.S.C. 154(b) by 99 days.

(21) Appl. No.: 12/480,977

(22) Filed: Jun. 9, 2009

Related U.S. Application Data

(60) Provisional application No. 61/060,290, filed on Jun. 10, 2008.

(51) Int. Cl.
*H03M 1/12* (2006.01)

(52) U.S. Cl. ........................................ 341/172; 341/161

(58) Field of Classification Search .................. 341/172, 341/161, 155, 156, 118, 120, 122
See application file for complete search history.

(56) References Cited

U.S. PATENT DOCUMENTS
7,002,506 B1 * 2/2006 Tadeparthy et al. .......... 341/161
* cited by examiner

*Primary Examiner* — Joseph Lauture

(57) ABSTRACT

Methods and systems are described for providing an analog-to-digital converter that uses reduced power and supply voltage. The analog-to-digital converter includes a sample phase configured to sample an incoming analog signal having an input signal range and compare the incoming analog signal to a reference voltage. The analog-to-digital converter also includes a feedback phase wherein the feedback phase receives sampled signal data corresponding to the incoming analog signal from the sample phase and is configured to produce an output signal comprising an output signal range, wherein the output signal range is equal to one half of the input signal range, and wherein the analog-to-digital converter has a feedback factor that is substantially greater than $\tfrac{1}{3}$.

18 Claims, 6 Drawing Sheets

SYSTEMS AND METHODS FOR PROVIDING AN ANALOG-TO-DIGITAL CONVERTER THAT USES REDUCED POWER AND SUPPLY VOLTAGE

CROSS-REFERENCE TO RELATED APPLICATIONS

This application claims the benefit of U.S. Provisional Patent Application No. 61/060,290, filed Jun. 10, 2008, assigned to the assignee of the present application, and incorporated herein by reference.

BACKGROUND

Analog-to-Digital Converters ["ADCs"] are conventionally used to convert analog electronic signals, typically input voltages, into digital signals for use in a wide variety of electronic devices. Recently, it has become desirable to reduce power consumption of electronic device components, such as ADCs, to conserve chip space and to increase battery life of electronic devices. This can be done, for example, by reducing the supply voltage of the ADC. As the supply voltage of an ADC decreases, however, there is a need for substantially constant signal swing in order to preserve an acceptable signal-to-noise ratio. When the signal strength decreases due to reduced supply voltage, the signal-to-noise ratio may become too small and cause the signal to become unusable.

There are additional considerations, other than signal-to-noise ratio, that should be accounted for when designing an ADC with reduced supply voltage. Although additional components may be added to the ADC, it is desirable to minimize the number of additional components in order to conserve chip space. Power consumption may also be a concern when adding additional components, because reduced supply voltage substantially translates into less voltage available for use to power these additional components.

The power consumption of an ADC may also be affected by the feedback factor of the ADC. The feedback factor is the ratio of the capacitance of the feedback capacitors used in ADC feedback phase. A greater feedback factor is desirable, because an increased feedback factor can allow a smaller (i.e., less power-consuming) op-amp to have the same settling speed as a larger op-amp, where settling speed refers to how quickly the output settles to its final value.

BRIEF SUMMARY

Methods and systems are described for providing an ADC that uses reduced power and supply voltage. The ADC includes a sample phase configured to sample an incoming analog signal having an input signal range and compare the incoming analog signal to a reference voltage. The ADC also includes a feedback phase (also known as a "hold phase") wherein the feedback phase receives sampled signal data corresponding to the incoming analog signal from the sample phase and is configured to produce an output signal, based on the sampled signal data, comprising an output signal range, wherein the range of the output signal range is equal to one half of the input signal range, and wherein the analog-to-digital converter has a feedback factor that is substantially greater than ⅓.

DETAILED DESCRIPTION

The present invention relates to an ADC that uses reduced power and supply voltage. The following description is presented to enable one of ordinary skill in the art to make and use the invention and is provided in the context of a patent application and its requirements. Various modifications to the embodiments and the generic principles and features described herein can be made. Thus, the present invention is not intended to be limited to the embodiments shown, but is to be accorded the widest scope consistent with the principles and features described herein.

Figure 1:
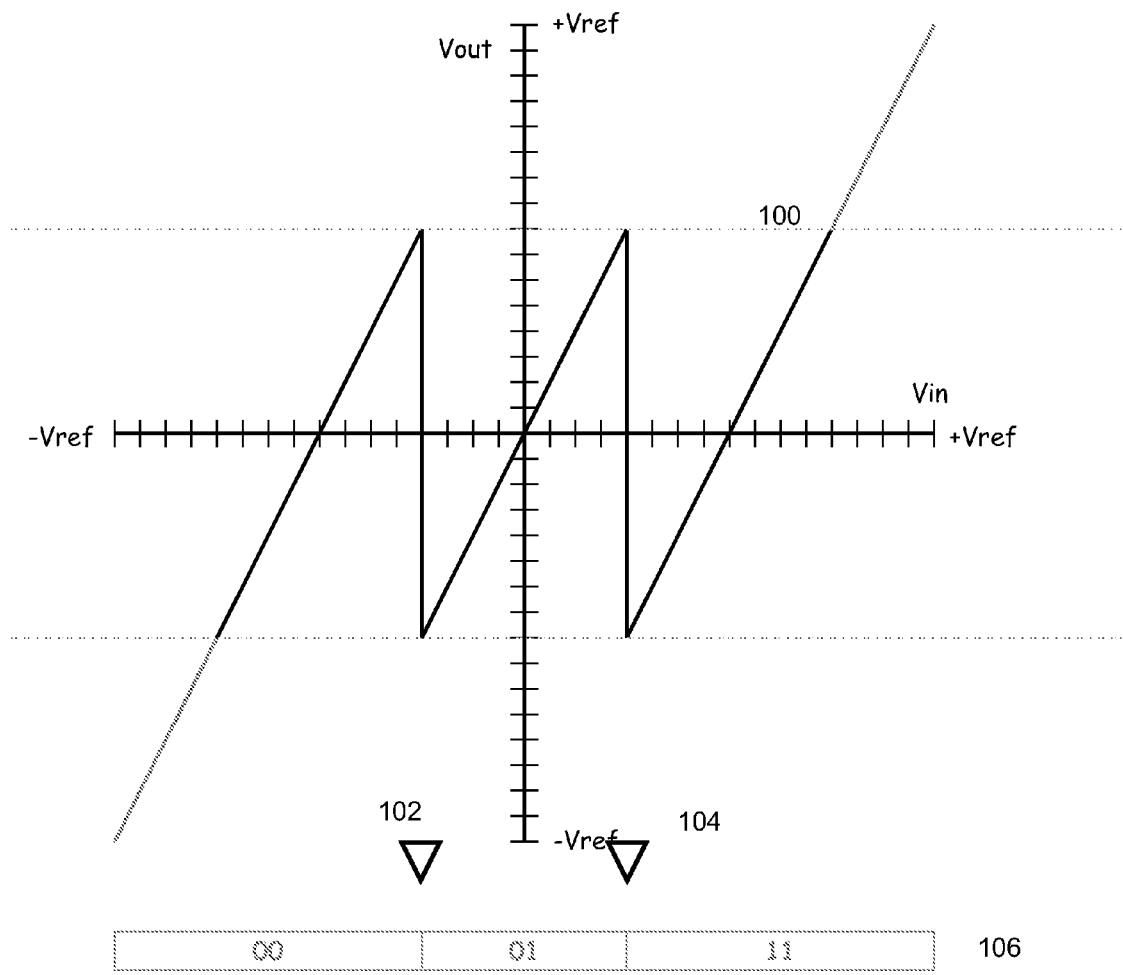
FIG. 1 illustrates the transfer function of a prior art ADC.

FIG. 1 illustrates the transfer function 100 of a conventional analog-to-digital converter (ADC). The conventional ADC shown is conventionally used as the first stage in a pipeline ADC. The x-axis corresponds to the input signal voltage $V_{in}$ and the y-axis corresponds to the output signal voltage $V_{out}$. The bar 106 at the bottom of the transfer function shows the output of the two comparators 102 and 104. Because there are two comparators, the transfer function has three pieces. The transfer function shows that the output voltage is $-V_{ref}$ when the input voltage is equal to $-V_{ref}$ and both comparators output a value of 0. The second piece of the transfer function, where $V_{in}$ ranges between $-V_{ref}/4$ and $V_{ref}/4$, corresponds to when a comparator (e.g., comparator 102) outputs a value of 1 and the other comparator (e.g., comparator 104) outputs a value of 0. Likewise, the third piece of the transfer function corresponds to when $V_{in}$ ranges between $V_{ref}/4$ and $V_{ref}$ and both comparators 102 and 104 output a value of 1. The transfer function 100 shows that an input voltage range, the peak-to-peak voltage range for the input signal, is equal to an output voltage range$_r$. That is, $V_{in}$ and $V_{out}$ each range between $\pm V_{ref}$ for the conventional ADC. As noted in the background, this can be disadvantageous when the supply voltage is reduced because signal strength is reduced while the noise in the circuit remains the same, thereby reducing the signal-to-noise ratio. Furthermore, because the output signal range must be the same as the input signal range, the supply voltage must be sufficient to produce an output voltage of $\pm V_{ref}$.

Figure 2:
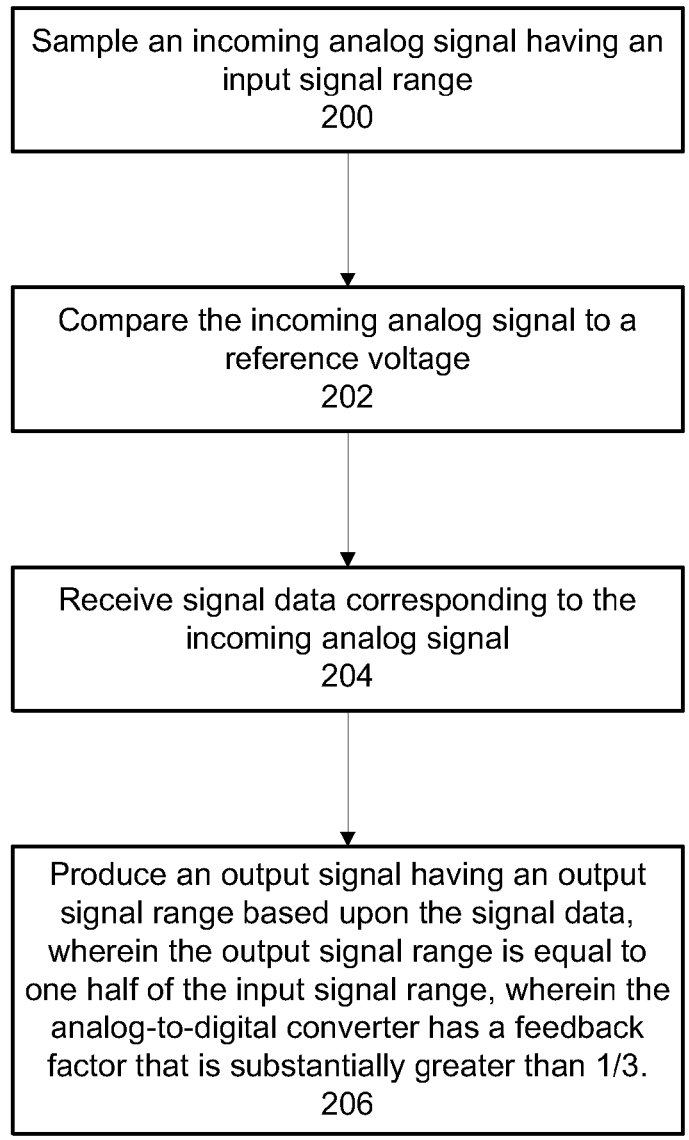
FIG. 2 illustrates an exemplary embodiment of a process providing an ADC that uses reduced power and supply voltage having an output signal range equal to one half of the input signal range.
Figure 3A:
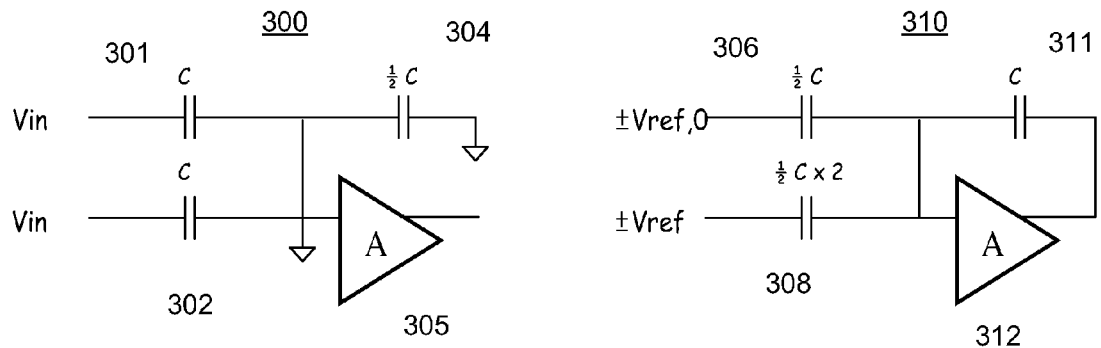
FIGS. 3A-3B illustrate an exemplary embodiment of an ADC that uses reduced power and supply voltage and its corresponding transfer function.
Figure 3B:
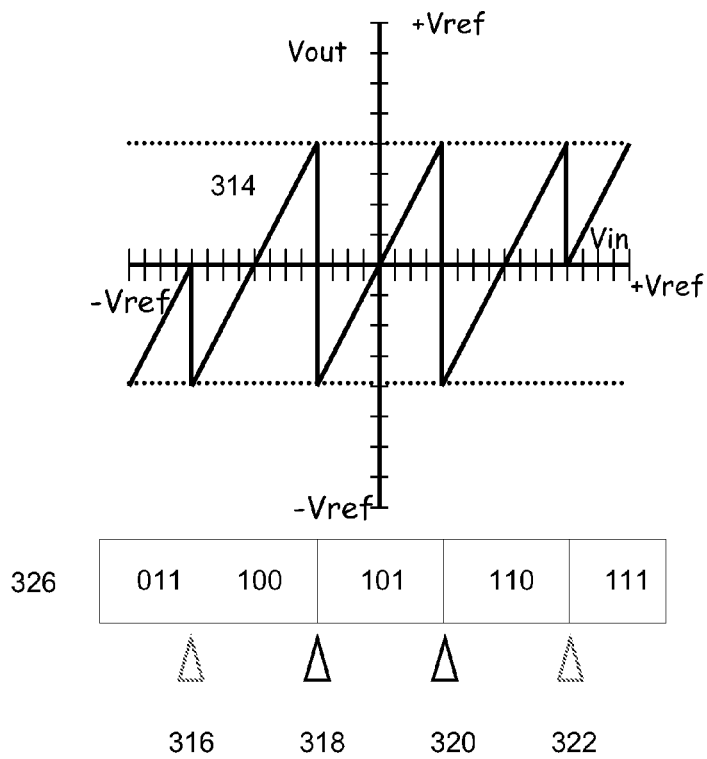

FIG. 2 illustrates an exemplary embodiment of a process providing an ADC that uses reduced power and supply voltage having an output signal range equal to one half of the input signal range. FIGS. 3A-3B illustrate an exemplary embodiment of an ADC that uses reduced power and supply voltage and its corresponding transfer function. FIG. 3A shows exemplary embodiments of a sample phase 300 and a feedback phase 310 of an ADC that uses reduced power and supply voltage, while FIG. 3B illustrates the transfer function 314 of an ADC that includes the sample phase 300 and the feedback phase 310 of the ADC shown in FIG. 3A. While in a preferred embodiment, the exemplary ADC that uses reduced power and supply voltage may be used as the first stage of a pipeline ADC, the exemplary ADC may be used in other ADC designs (e.g., a successive-approximation ADC, a flash ADC, etc.).

Referring to both FIGS. 2 and 3A-3B, an incoming analog signal having an input signal range is sampled (block 200). The incoming analog signal may come from any source of an analog voltage signal, including a sensor and/or transducer. The sampling may be performed, as shown in FIG. 3A, for example, using capacitors 301, 302, 304 connected to an input terminal of op-amp 305. The incoming analog signal is compared to a reference voltage (block 202). This can be done, for example, by comparators 316, 318, 320, and 322, which may compare the incoming analog signal to a reference voltage corresponding to a digital value.

Sampled signal data corresponding to the incoming analog signal is received (block 204). The sampled signal data includes data allowing a digital signal to be produced that approximates the incoming analog signal, and can be the digital values corresponding to the comparator outputs, for example. An output signal having an output signal range based upon the sampled signal data is produced, wherein the output signal range is equal to one half of the input signal range, wherein the analog-to-digital converter has a feedback factor that is substantially greater than ⅓ (block 206). By having a reduced output signal range, less power is required to produce the output signal. For example, if the incoming analog signal has a 1.0 V input signal range, the supply voltage for the ADC only needs to be 0.5 V, because the output signal range for the ADC only has a 0.5 V output signal swing. By contrast, the conventional ADC shown in FIG. 1 would require a 1.0 V supply voltage, because the output signal range is equal to the input signal range.

Also, as shown in the exemplary embodiment in FIGS. 3A-3B, the analog-to-digital converter has a feedback factor that is substantially greater than ⅓. The feedback factor in the exemplary ADC has a feedback factor of $1/(c+c+0.5*c)=1/2.5c$, where c is the capacitance of the capacitors 301 and 302. The feedback factor is therefore $(1-(2.5/3))100=16.7\%$ more than the feedback factor of conventional ADCs using extra folding (i.e., reuse comparators when processing an input signal). The increased feedback factor may be advantageous because the settling speed of the ADC may be increased without consuming more current (as a larger op-amp), thereby improving efficiency and reducing power consumption.

According to one aspect of the exemplary embodiments, pipeline ADCs can be designed so that the output of a first ADC (the "first stage" ADC) is used as the input of the second ADC (the "second stage" ADC) in a pipeline analog-to-digital converter system comprising at least two analog-to-digital converters. In such a pipeline ADC system, merely substituting the first ADC with an ADC using the process in FIG. 2 could transmit the power savings gained from reducing the supply voltage to the remainder of the pipeline ADC, rendering the ADC described in FIG. 2 "backwards compatible" with existing pipeline ADC systems.

As stated above, FIG. 3A shows exemplary embodiments of a sample phase 300 and a feedback phase 310 of an ADC that uses reduced power and supply voltage, while FIG. 3B illustrates the transfer function 314 of an ADC that includes the sample phase 300 and the feedback phase 310 of the ADC shown in FIG. 3A. The sample phase 300 is configured to sample an incoming analog signal having an input signal range and compare the incoming analog signal to a reference voltage. In order to sample the incoming analog signal for comparison with the reference voltages, capacitors 301, 302, and 304 are used in the exemplary embodiment. In FIGS. 3A-3B and FIGS. 4A-4B, capacitors with capacitance c may include two distinct capacitors, each having a capacitance of c/2, coupled in parallel in the exemplary embodiment.

Using effectively three capacitors of equal capacitance, as is done in conventional extra folding in ADCs causes a feedback factor of substantially ⅓ to be present in the system. The analog-to-digital converter of FIG. 3A, however, has a feedback factor that is substantially greater than ⅓. In the exemplary embodiment, two of the three capacitors (e.g., capacitors 301 and 302) have substantially equivalent capacitance and the third capacitor (e.g., capacitor 304) has substantially half of the capacitance of each of the first two capacitors, which may increase the feedback factor to approximately 1/2.5, as described above. This increase in feedback factor may cause a corresponding decrease in load on the reference driver for the reference voltage because a smaller op-amp may be used to achieve the same settling speed, thereby making possible a reduction in supply voltage for the ADC. Furthermore, using a smaller capacitor for capacitor 304 can lead to savings of chip space, since the smaller capacitance can correspond to a physically smaller capacitor.

The feedback phase 310 receives sampled signal data corresponding to the incoming analog signal from the sample phase 300 and is configured to produce an output signal, based upon the sampled signal data, comprising an output signal range, wherein the output signal range is equal to one half of the input signal range. Based upon the output of comparators 316, 318, 320, and 322, switches are configured to adjust the reference voltage coupled to capacitor 306 to one of three values: $V_{ref}$, $-V_{ref}$ and zero. Similarly, switches are configured to adjust the reference voltage coupled to capacitor 308 to one of two values: $V_{ref}$ and $-V_{ref}$. Capacitors 306 and 308, along with capacitor 311, may be connected to an input of op-amp 312.

FIG. 3B illustrates the transfer function resulting from the ADC shown in FIG. 3A. As above, the x-axis corresponds to the input signal voltage $V_{in}$ and the y-axis corresponds to the output signal voltage $V_{out}$ produced at the output of the op-amp 312 The table 326 at the bottom of the transfer function shows the output of the four comparators 316, 318, 320, and 322. Because there are four comparators, the transfer function has five pieces as $V_{in}$ varies from $-V_{ref}$ to $+V_{ref}$ As the comparator decisions change in the table 326, the output of the ADC makes a corresponding change, thereby breaking the transfer function into the five pieces shown. The output signal voltage $V_{out}$ has an output signal range of $\pm V_{ref}/2$, which is equal to one half of the input signal range, which is $\pm V_{ref}$. Because the output signal range is one half of the input signal range, less supply voltage for the ADC is needed, thereby conserving supply voltage and permitting the ADC to be smaller in physical size.

Figure 4A:
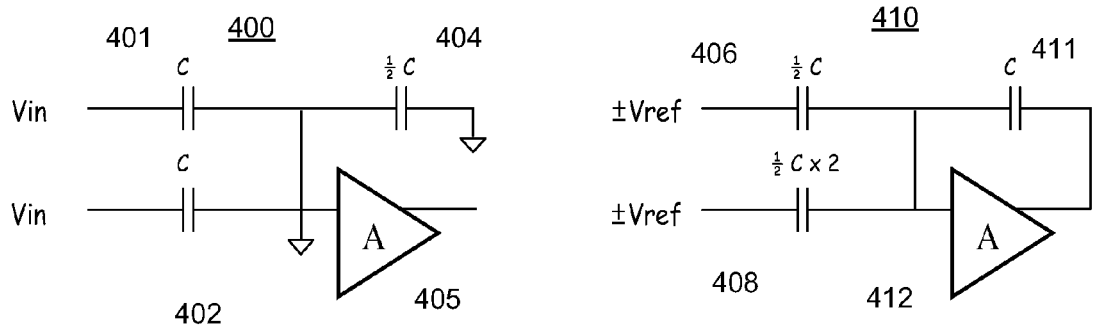
FIGS. 4A-4B illustrate another exemplary embodiment of an ADC that uses reduced power and supply voltage and its corresponding transfer function.
Figure 4B:
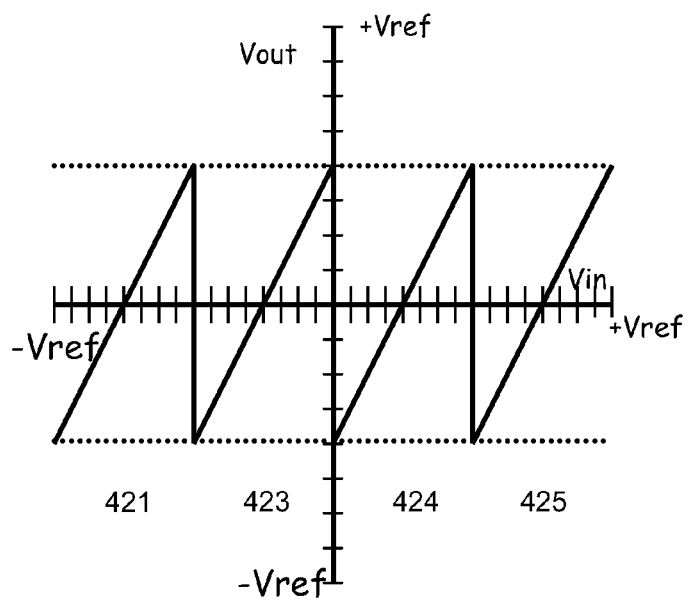

FIGS. 4A-4B illustrate another exemplary embodiment of an ADC that uses reduced power and supply voltage and its corresponding output transfer function. FIG. 4A shows exemplary embodiments of a sample phase 400 and a feedback phase 410 of an ADC that uses reduced power and supply voltage, while FIG. 4B illustrates the transfer function 414 of an ADC that includes the sample phase 400 and the feedback phase 410 of the ADC shown in FIG. 4A. The sample phase 400 of the exemplary ADC is substantially the same as the sample phase 300 of the ADC in FIG. 3A, except that three comparators 416, 418, and 420 are used instead of four comparators. Capacitor 404 is set to have one half of the capacitance of the other capacitors 401 and 402. The feedback factor is substantially the same as well, approximately 1/2.5. Also, because three comparators are used instead of four, only two reference voltages for production of the output signal are used in the feedback phase 410 instead of three. As indicated in FIG. 4A, the reference voltages provide voltages of $\pm V_{ref}$.

Using three comparators 416, 418, and 420 in the sample phase 400 instead of four is advantageous at least because, in the feedback phase 410, only two reference voltages are needed to be connected to capacitors 406 and 408, which along with capacitor 411 are connected to the input of op-amp 412, saving chip space. Having three comparators is also advantageous because elimination of a comparator directly reduces both power consumption and the size of the ADC. In embodiments where the ADC is the first stage in a pipeline ADC where there is no separate sample-and-hold phase, the power savings from removal of a comparator may be 25%.

FIG. 4B illustrates the transfer function resulting from the ADC shown in FIG. 4A. As above, the x-axis corresponds to the input signal voltage $V_{in}$ and the y-axis corresponds to the output signal voltage $V_{out}$. The table 426 at the bottom of the transfer function shows the output of the three comparators 416, 418, and 420. Because there are three comparators, the transfer function has four pieces as $V_{in}$ varies from $-V_{ref}$ to $+V_{ref}$, unlike the transfer function shown in FIG. 3B. As in FIG. 3B, the changes in the comparator decisions in the table 426 cause corresponding changes in the output of the ADC, thereby breaking the transfer function into the four pieces shown (indicated by the reference numbers 421, 423, 424, and 425). As shown in FIG. 3B, the output signal voltage $V_{out}$ has an output signal range of $\pm V_{ref}/2$, which is equal to one half of the input signal range, which is $\pm V_{ref}$. Again, because the output signal range is one half of the input signal range, less supply voltage for the ADC is needed, thereby conserving supply voltage and permitting the ADC to be smaller in physical size.

Figure 5:
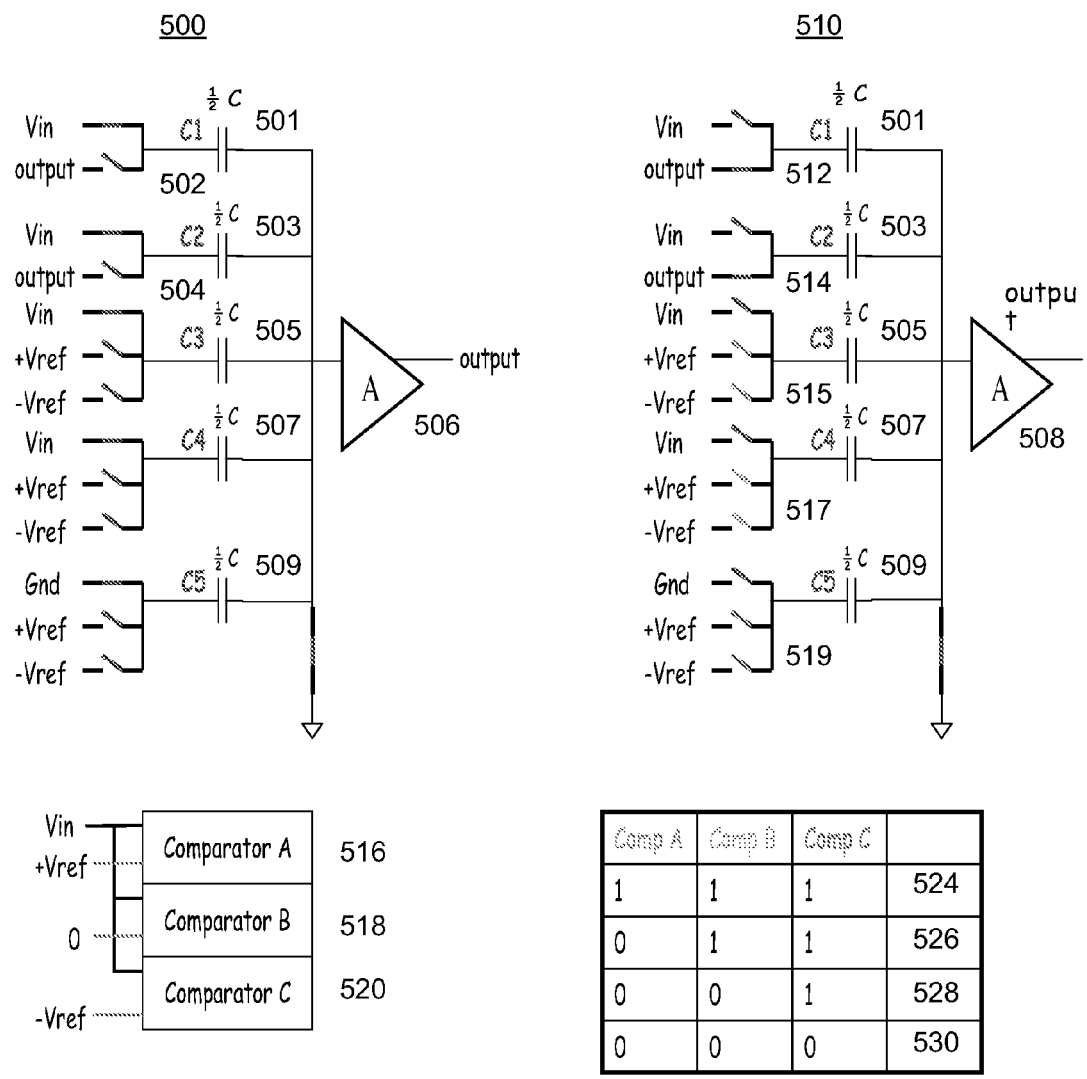
FIG. 5 illustrates a sample and feedback phase of an ADC that uses reduced power and supply voltage.

FIG. 5 illustrates a sample and feedback phase of an ADC that uses reduced power and supply voltage, specifically an embodiment of the ADC topology displayed in FIGS. 4A-4B. FIG. 500 illustrates an ADC configuration during the sample phase, where switches 502 and 504 couple capacitors C1 501 and C2 503 with capacitance c/2 to V. During the sample phase, the ADC may store an analog value corresponding to the incoming analog signal in at least one of the capacitors and, at substantially the same time, the comparators may compare the incoming analog signal with the reference voltages. For example, the ADC may sample the input voltage $V_{in}$ and store the analog value in capacitors C1 501, C2 503, C3 505, and C4 507. At substantially the same time, comparators 516, 518, and 520 may compare the input voltage $V_{in}$ with $+V_{ref}$, $-V_{ref}$, and zero voltages. Specifically, comparator A 516 compares the input voltage with $+V_{ref}$, comparator B 518 compares the input voltage with 0, and comparator C 520 compares the input voltage with $-V_{ref}$.

FIG. 510 illustrates an ADC configuration during the feedback phase. Switches 512 and 514 couple capacitors C1 501 and C2 503 between the input and the output of the op-amp 508 as the feedback capacitor (e.g., capacitor 411). Capacitors C3 505, C4 507 and C5 509 are coupled according to the decisions of the comparators 516, 518, 520, which affect switches 515, 517, and 519 respectively. Switches 515, 517, and 519 are all shown to be open in FIG. 510, and the switches remain open until the decisions from the comparators 516, 518, and 520 are received.

In an exemplary embodiment, during the feedback phase of the ADC, there may be four different capacitor connections corresponding to four different potential combinations of decisions made by the comparators during the sample phase. Table 522 illustrates an example of such an embodiment, as there are four different capacitor connections corresponding to four different potential combinations of comparator decisions 524, 526, 528, and 530. FIGS. 6A-D illustrate the four different capacitor connections corresponding to comparator decisions 530, 528, 526, and 524 respectively. The different capacitor connections in FIGS. 6A-6D also produce four different output signals at the output 508 of the feedback phase, which correspond to the four pieces of the transfer function 421, 423, 424, and 425 in FIG. 4B.

Figure 6A:
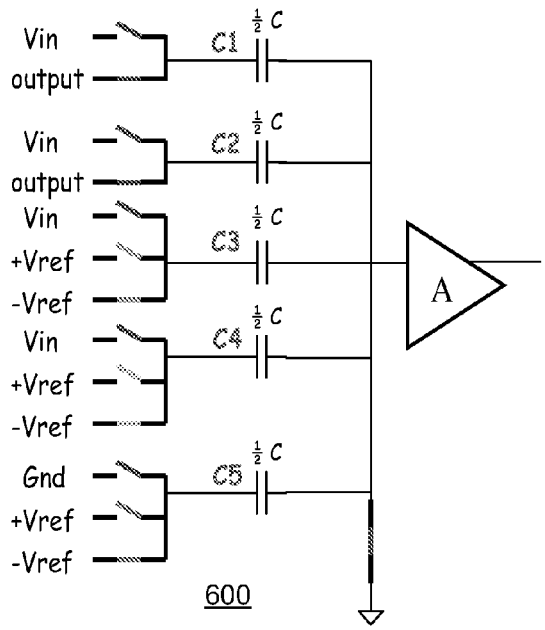
FIGS. 6A-D illustrate a feedback phase of an ADC that uses reduced power and supply voltage as coupled to various voltage values depending on decisions made by comparators in the ADC.
Figure 6B:
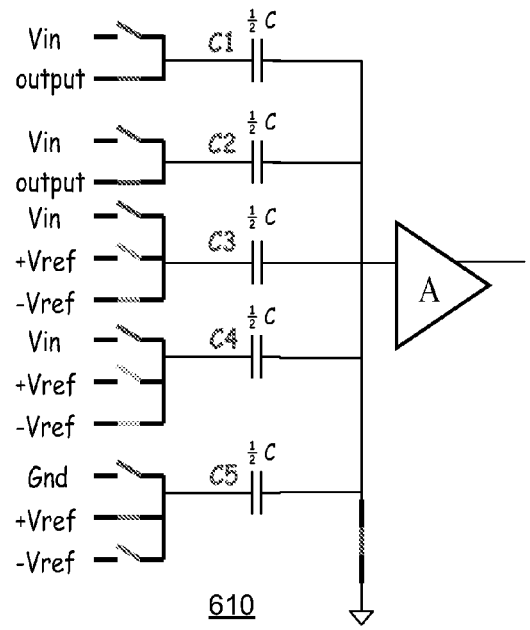
Figure 6C:
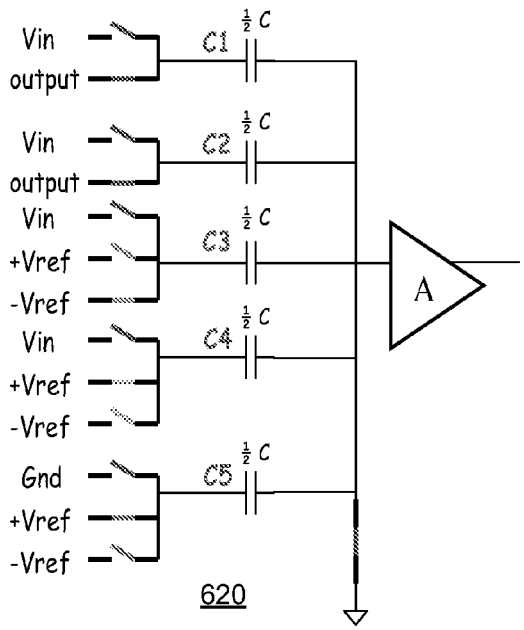
Figure 6D:
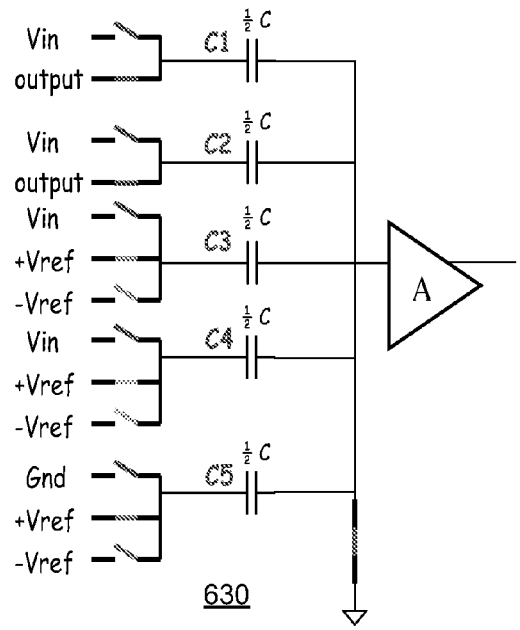

For example, capacitor C3 505 may be connected to $+V_{ref}$ if the decision (output) of comparator A 516 is 1, meaning that the input voltage $V_{in}$ is larger than $+V_{ref}$. This connection is shown in FIG. 6D. Otherwise, capacitor C3 505 may be connected to $-V_{ref}$, meaning that the input voltage $V_{in}$ is smaller than $+V_{ref}$, as is shown in FIGS. 6A-C. Likewise capacitor C4 507 may be connected to $+V_{ref}$ if the decision of comparator B 518 is 1, meaning that the input voltage $V_{in}$ is larger than zero, as shown in FIGS. 6C-D. Otherwise, capacitor C4 507 may be connected to $-V_{ref}$, meaning the input voltage $V_{in}$ is less than zero, as shown in FIGS. 6A-B. Also, capacitor C5 509 may be connected to $+V_{ref}$ if the decision of comparator C 520 is 1, meaning that the input voltage $V_{in}$ is greater than $-V_{ref}$, as is shown in FIGS. 6B-D. Otherwise, capacitor C5 509 may be connected to $-V_{ref}$, meaning that the input voltage $V_{in}$ is less than $-V_{ref}$, as is shown in FIG. 6A.

A method and system for an ADC that uses reduced power and supply voltage has been disclosed. The present invention is mainly described in terms of particular systems provided in particular implementations. However, this method and system may operate effectively in other implementations. For example, the systems, devices, and networks usable with the present invention can take a number of different forms. The present invention will also be described in the context of particular methods having certain steps. However, the method and system operate effectively for other methods having different and/or additional steps not inconsistent with the present invention.

The present invention has been described in accordance with the embodiments shown, and there could be variations to the embodiments, and any variations would be within the scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Accordingly, many modifications may be made without departing from the scope of the appended claims.

We claim:

1. An analog-to-digital converter that uses reduced power and supply voltage comprising:
   a sample phase configured to sample an incoming analog signal having an input signal range and compare the incoming analog signal to a reference voltage; and
   a feedback phase wherein the feedback phase receives sampled signal data corresponding to the incoming analog signal from the sample phase and is configured to produce an output signal, based upon the sampled signal data, comprising an output signal range, wherein the output signal range is equal to one half of the input signal range, and wherein the analog-to-digital converter has a feedback factor that is substantially greater than ⅓.

2. The analog-to-digital converter of claim 1 wherein the sample phase comprises four comparators for comparing the incoming analog signal, and three capacitors, wherein two of the three capacitors have substantially equivalent capacitance and the third capacitor has substantially half of the capacitance of each of the first two capacitors, and the feedback phase comprises three reference voltages for production of the output signal.

3. The analog-to-digital converter of claim 1 wherein the sample phase comprises three comparators for comparing the incoming analog signal, and three capacitors, wherein two of the three capacitors have substantially equivalent capacitance and the third capacitor has substantially half of the capacitance of each of the first two capacitors, and the feedback phase comprises two reference voltages for production of the output signal.

4. The analog-to-digital converter of claim 3 wherein during the sample phase an analog value corresponding to the incoming analog signal is stored in at least one of the three capacitors and, at substantially the same time, the three comparators compare the incoming analog signal with the reference voltages.

5. The analog-to-digital converter of claim 3 wherein during the feedback phase there are four different capacitor connection configurations corresponding to four different potential combinations of decisions made by the three comparators during the sample phase.

6. The analog-to-digital converter of claim 1 wherein the analog-to-digital converter is a first stage of a pipeline analog-to-digital converter system comprising at least two analog-to-digital converters.

7. A method for providing a analog-to-digital converter that uses reduced power and supply voltage, comprising:
sampling an incoming analog signal comprising an input signal range;
comparing the incoming analog signal to a reference voltage;
receiving sampled signal data corresponding to the incoming analog signal; and
producing an output signal, based upon the sampled signal data, comprising an output signal range, wherein the output signal range is equal to one half of the input signal range, wherein the analog-to-digital converter has a feedback factor that is substantially greater than ⅓.

8. The method of claim 7 wherein the sampling and the comparing the incoming analog signal are performed during a sample phase comprising four comparators for comparing the incoming analog signal, and three capacitors, wherein two of the three capacitors have substantially equivalent capacitance and the third capacitor has substantially half of the capacitance of each of the first two capacitors, and three reference voltages are used to produce the output signal.

9. The method of claim 7 wherein the sampling and the comparing the incoming analog signal are performed during a sample phase comprising three comparators for comparing the incoming analog signal, and three capacitors, wherein two of the three capacitors have substantially equivalent capacitance and the third capacitor has substantially half of the capacitance of each of the first two capacitors, and two reference voltages are used to produce the output signal.

10. The method of claim 9 wherein during the sample phase an analog value corresponding to the incoming analog signal is stored in at least one of the three capacitors and, at substantially the same time, the three comparators compare the incoming analog signal with the reference voltages.

11. The method of claim 9 wherein the producing an output signal is performed during a feedback phase, wherein the feedback phase includes four different capacitor connection configurations corresponding to four different potential combinations of decisions made by the three comparators during the sample phase.

12. The method of claim 7 further comprising outputting the output signal to an input terminal of another analog-to-digital converter.

13. An analog-to-digital converter that uses reduced power and supply voltage comprising:
a sample phase means configured to sample an incoming analog signal having an input signal range and compare the incoming analog signal to a reference voltage; and
a feedback phase means wherein the feedback phase means receives sampled signal data corresponding to the incoming analog signal from the sample phase means and is configured to produce an output signal, based upon the sampled signal data, comprising an output signal range, wherein the output signal range is equal to one half of the input signal range, and wherein the analog-to-digital converter has a feedback factor that is substantially greater than ⅓.

14. The analog-to-digital converter of claim 13 wherein the sample phase means comprises four comparator means for comparing the incoming analog signal, and three capacitors, wherein two of the three capacitors have substantially equivalent capacitance and the third capacitor has substantially half of the capacitance of each of the first two capacitors, and the feedback phase means comprises three reference voltages for production of the output signal.

15. The analog-to-digital converter of claim 13 wherein the sample phase means comprises three comparator means for comparing the incoming analog signal, and three capacitors, wherein two of the three capacitors have substantially equivalent capacitance and the third capacitor has substantially half of the capacitance of each of the first two capacitors, and the feedback phase means comprises two reference voltages for production of the output signal.

16. The analog-to-digital converter of claim 15 wherein during the sample phase means stores an analog value corresponding to the incoming analog signal in at least one of the three capacitors and, at substantially the same time, the three comparator means compare the incoming analog signal with the reference voltages.

17. The analog-to-digital converter of claim 15 wherein the feedback phase means includes four different capacitor connection configurations corresponding to four different potential combinations of decisions made by the three comparator means during the sample phase means.

18. The analog-to-digital converter of claim 13 wherein the analog-to-digital converter is a first stage of a pipeline analog-to-digital converter system comprising at least two analog-to-digital converters.

* * * * *